United States Patent
Chan et al.

(10) Patent No.: US 7,295,457 B2
(45) Date of Patent: Nov. 13, 2007

(54) INTEGRATED CIRCUIT CHIP WITH IMPROVED ARRAY STABILITY

(75) Inventors: Yuen H. Chan, Poughkeepsie, NY (US); Rajiv V. Joshi, Yorktown Heights, NY (US); Donald W. Plass, Pleasent Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 10/950,940

(22) Filed: Sep. 27, 2004

(65) Prior Publication Data

US 2005/0063232 A1    Mar. 24, 2005

Related U.S. Application Data

(63) Continuation-in-part of application No. 10/306,938, filed on Nov. 29, 2002, now Pat. No. 6,798,688.

(51) Int. Cl.
*G11C 11/00* (2006.01)
*G11C 8/00* (2006.01)

(52) U.S. Cl. .............. 365/154; 365/15.64; 365/230.05; 365/230.06

(58) Field of Classification Search .............. 365/154, 365/156, 63, 226, 230.05, 230.06, 233; 327/534; 438/289
See application file for complete search history.

(56) References Cited

U.S. PATENT DOCUMENTS

| | | | |
|---|---|---|---|
| 5,930,163 A * | 7/1999 | Hara et al. ................ 365/154 |
| 6,027,978 A * | 2/2000 | Gardner et al. ............ 438/289 |
| 6,057,188 A | 5/2000 | El-Kareh et al. | |
| 6,326,809 B1 | 12/2001 | Gambles et al. | |
| 6,515,521 B2 | 2/2003 | Kono et al. | |
| 6,534,807 B2 | 3/2003 | Mandelman et al. | |
| 6,621,325 B2 * | 9/2003 | Gitlin et al. ................ 327/534 |
| 6,677,780 B2 | 1/2004 | Tanaka et al. | |
| 6,683,805 B2 | 1/2004 | Joshi et al. | |
| 6,798,682 B2 * | 9/2004 | Chuang et al. ............ 365/226 |
| 6,798,688 B2 * | 9/2004 | Joshi ......................... 365/154 |
| 6,868,000 B2 * | 3/2005 | Chan et al. ................. 365/154 |
| 6,990,038 B1 * | 1/2006 | Chan et al. ............. 365/230.06 |
| 7,006,403 B2 * | 2/2006 | Joshi et al. ............. 365/230.06 |
| 2003/0147272 A1 | 8/2003 | Joshi et al. | |
| 2003/0189849 A1 | 10/2003 | Khellah et al. | |

* cited by examiner

*Primary Examiner*—Trong Phan
(74) *Attorney, Agent, or Firm*—Law Office of Charles W. Peterson, Jr.; Louis J. Percello, Esq.; Rafael Perez-Pineiro, Esq.

(57) ABSTRACT

A multi-threshold integrated circuit (IC) that may be supplied by multiple supplies, with an array of latches such as an array static random access memory (SRAM) cells and a CMOS SRAM with improved stability and reduced subthreshold leakage. Selected devices (NFETs and/or PFETs) in array cells and support logic, e.g., in the data path and in non-critical logic, are tailored for lower gate and subthreshold leakage. Normal base FETs have a base threshold and tailored FETs have a threshold above. In a multi-supply chip, circuits with tailored FETs are powered by an increased supply voltage.

8 Claims, 2 Drawing Sheets

INTEGRATED CIRCUIT CHIP WITH IMPROVED ARRAY STABILITY

CROSS REFERENCE TO RELATED APPLICATION

The present invention is a continuation in part of U.S. patent application Ser. No. 10/306,938, entitled "Storage Array Such As A SRAM with Reduced Power Requirements" to Joshi, published as US 2004/0105299 A1, now issued as U.S. Pat. No. 6,798,688 B2; and U.S. application Ser. No. 10/307,168, entitled "Reduced Integrated Circuit Chip Leakage and Method of Reducing Chip Leakage" to Chuang et al., published as US 2004/0105300 A1, now issued as U.S. Pat. No. 6,798,682 B2; both filed Nov. 29, 2002 and published Jun. 3, 2004 and is related to U.S. Pat. application Ser. No. 10/644,211, entitled "Method Of Reducing Leakage Current In Sub One Volt SOI Circuits" to Richard B. Brown et al., filed Aug. 22, 2003, now issued as U.S. Pat. No. 6,952,113 B2, all assigned to the assignee of the present invention.

FIELD OF THE INVENTION

The present invention is related to integrated circuit (IC) chips and more particularly to improving static random access memory (SRAM) stability while reducing IC power consumption.

BACKGROUND DESCRIPTION

Semiconductor technology and chip manufacturing advances have resulted in a steady decrease of chip feature size to increase on-chip circuit switching frequency (circuit performance) and the number of transistors (circuit density). Shrinking/reducing device or field effect transistor (FET) feature sizes and, correspondingly, device minimum dimensions including horizontal dimensions (e.g., minimum channel length) and vertical dimensions (e.g., channel layer depth, gate dielectric thickness, junction depths and etc.) shrinks device size for increased device density and device performance, as well as reduces device operating conditions, i.e., chip and correspondingly, device supply voltages and voltage swings. Generally, all other factors being constant, the active power consumed by a given unit increases linearly with switching frequency, i.e., performance. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, reducing net power consumption is important but, such a power reduction must come without degrading chip/circuit performance below acceptable levels.

To minimize semiconductor circuit power consumption, most integrated circuits (ICs) are made in the well-known complementary insulated gate FET technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (modeled simply as a closed switch), the other device (the PFET) is off, not conducting (ideally modeled as an open switch) and, vice versa. Thus, ideally, there is no static or DC current path in a typical CMOS circuit and ideal CMOS circuits use no static or DC power and only consume transient power from charging and discharging capacitive loads.

A CMOS inverter, for example, is a PFET and NFET pair that are series connected between a power supply voltage ($V_{dd}$) and ground (GND). Both are gated by the same input and both drive the same output, typically a capacitive load. The PFET pulls the output high and the NFET pulls the output low at opposite input signal states. Ideally, when the gate of a NFET is below some positive threshold voltage ($V_T$) with respect to its source, the NFET is off, i.e., the switch is open. Above $V_T$, the NFET is on conducting current, i.e., the switch is closed. Similarly, a PFET is off when its gate is above its $V_T$, i.e., less negative, and on below $V_T$. Similarly, a typical CMOS storage cell, such as a static random access memory (SRAM) cell includes a pair of cross coupled such inverters as a storage latch and a pair of pass gates attached to the inverters for reading and writing the cell. When one of the inverters is driving high, the other is driving low (e.g., latching a 1) and vice versa (e.g., latching a zero). An ideal SRAM cell conducts no DC current through either of the cross coupled inverters or through either of the pass gates and holds its current state until it is written over, i.e., turning on the pass gates and forcing the opposite state.

In practice, typical FETs are much more complex than switches and transient power for circuit loads accounts for only a portion of CMOS chip power consumption. FET drain to source current (DC current and so, DC power consumed) is dependent upon circuit conditions and device voltages. Especially since device $V_T$ is directly proportional to gate dielectric thickness, as FET features (including gate dielectric thickness) shrink, off FETs conduct what is known as subthreshold current, i.e., at gate biases below threshold for NFETs and above for PFETs. Further, for a particular device, subthreshold current increases exponentially with the magnitude of the device's drain to source voltage ($V_{ds}$) and reduces exponentially with the magnitude of the device's $V_T$. This is especially true in what is known as partially depleted (PD) or fully depleted (FD) silicon on insulator (SOI) technologies, where subthreshold leakage has been shown to increase dramatically, such that it may be the dominant source of leakage. Additional device leakages including gate leakages (i.e., gate to channel, gate to source or drain and gate induced drain leakage (GIDL)) and source/drain junction leakages also contribute to static power.

When multiplied by the millions and even billions of devices on a state of the art SRAM, even 100 picoAmps (100 pA) of leakage in each of a million cells, for example, results in chip leakage on the order of 100 milliAmps (100 mA). Thus, as SRAM chip features have shrunk, these leakage sources have become more prominent. It has become especially difficult to scale gate dielectric simply because gate dielectric thickness is reaching its limit. At a few monolayers of Silicon, for example, deposition non-uniformity causes pinholes and dielectric porosity becomes a problem dramatically lowering yield. Pinholes and dielectric porosity can cause catastrophic failures such as gate to channel shorts that develop over time with use. Further, deposition non-uniformity can cause device to device threshold variations that may be intolerable, e.g., where a matched pair of devices are needed. Moreover, supply voltages cannot be scaled appropriately, e.g., because of severely reduced device drive, especially for PFETs, from device threshold instability over time and moderate mobility gains. So, as the leakage is increasing, device drive characteristics are falling off and the leakage has resulted in degraded performance and reduced device functionality, not to mention reduced circuit noise immunity and stability. Generally, approaches to increasing device $V_T$ to mitigate subthreshold leakage, e.g., with thicker gate dielectric or back biasing device channels for example, have been applied uniformly across all circuits on a chip. Especially for complex chips and arrays with a large number of devices, device leakage (both gate and subthreshold) chip leakage power can be overwhelming, but leakage reduction techniques are equally unpalatable. So unfortunately, leakage and gate dielectric limits have become constraints on performance and chip density.

Thus, there is a need for improved SRAM cell stability and reduced cell leakage with minimal performance degradation and in particular for maximizing device off resistance while minimizing device on resistance, especially for PD SOI IC chips.

SUMMARY OF THE INVENTION

It is a purpose of the invention to improve static random access memory (SRAM) cell stability;

It is another purpose of the invention to reduce SRAM cell leakage;

It is yet another purpose of the invention to improve SRAM stability and reduce leakage while minimizing performance degradation;

It is yet another purpose of the invention to improve SRAM stability and reduce leakage while minimizing performance degradation in PD SOI CMOS SRAMs;

It is yet another purpose of the invention to improve SRAM stability on PD SOI CMOS IC chips while reducing PD SOI CMOS IC chip leakage.

The present invention relates to a multi-threshold integrated circuit (IC) that may be supplied by multiple supplies, with an array of latches such as an array static random access memory (SRAM) cells and a CMOS SRAM with improved stability and reduced subthreshold leakage. Selected devices (NFETs and/or PFETs) in array cells and support logic, e.g., in the data path and in non-critical logic, are tailored for lower gate and subthreshold leakage. Normal base FETs have a base threshold $(V_T)$ and tailored FETs have a threshold $(V_{T+})$ above $V_T$. Circuits without tailored FETs may be powered by a normal supply voltage $(V_{dd})$ and circuits with tailored FETs may be powered by an increased supply voltage $(V_{dd+})$.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
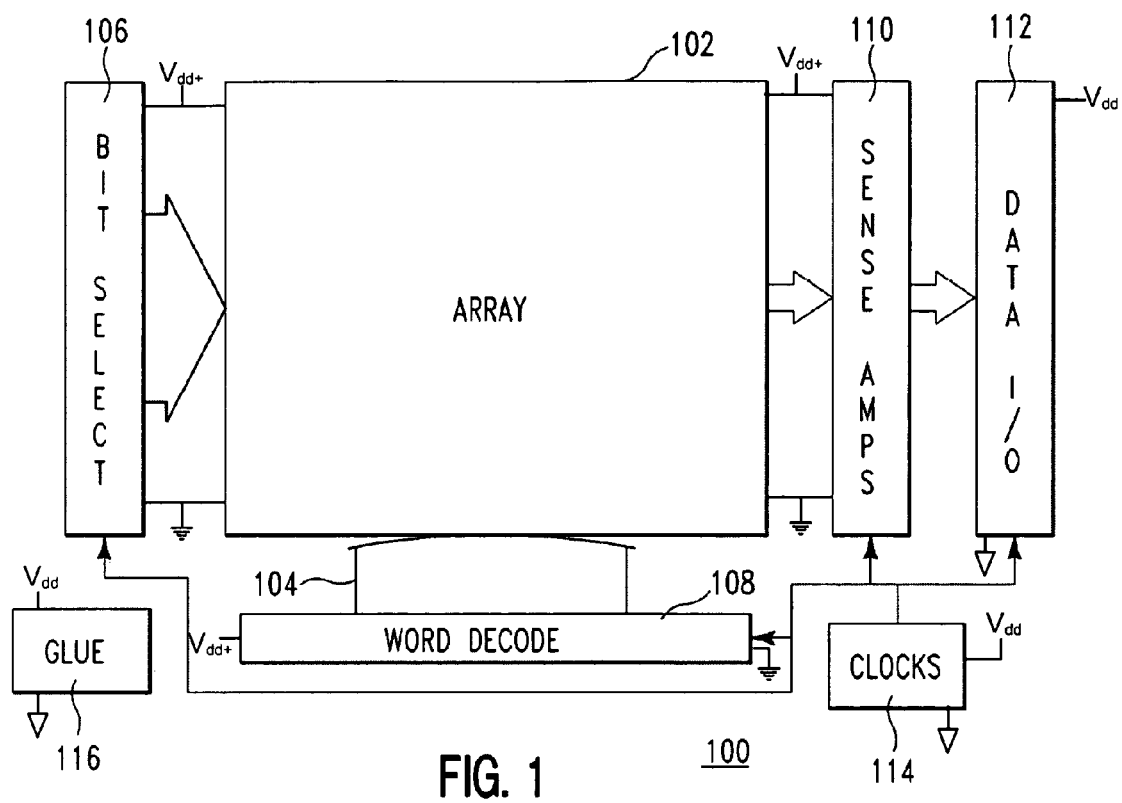
FIG. 1 shows a multi-threshold CMOS (MTCMOS) technology SRAM example with low leakage power.

Turning now to the drawings and, more particularly, FIG. 1 shows a multi-threshold CMOS (MTCMOS) storage circuit 100 (e.g., memory), macro or chip, according to a preferred embodiment of the present invention. Preferably, the chip is supplied with multiple supply voltages with at least one increased supply that is provided to selected circuits or portions of circuits, e.g., the array 102 and selected support circuits, such as word line drivers 104. Selected devices or field effect transistors (FETs) in those circuits 102, 104 are tailored to reduce leakage current and to be resistant to increased leakage from bias conditions. In particular, support circuit FETs in the storage circuit have a base device design threshold $(V_T)$ that is typical for the base technology and horizontally equivalent tailored FETs (i.e., same design length and width) have a higher threshold voltage $(V_{T+})$, e.g., from thicker gate oxide and channel doping for reduced subthreshold leakage. Individual functions (e.g., logic gates, timing circuits and etc.), especially critical path functions primarily include base design devices. Any performance that might otherwise be lost from inclusion of the tailored FETs is offset by a corresponding increase in supply voltage to those circuits with tailored FETs and to the array 102, which also improves cell stability for the array 102.

It should be noted that for convenience of description, the circuits with tailored devices are described with reference to tailored n-type FETs (NETs). However, this is for example only and circuits may be provided with tailored p-type FETs (PFETs) as well as or instead of tailored NFETs. Furthermore, while the present invention has application to improving leakage and stability in almost any array 102 of typical storage latches, such as an array of static random access memory (SRAM) cells in any insulated gate technology such as CMOS including for single supply chips as well as multiple supply chips. The present invention is most advantageous to application in the CMOS technology known as partially depleted (PD) silicon on insulator (SOI) technology that has a stated base design material or base design rule gate oxide thickness and especially wherein the stated design thickness is appropriately scaled with horizontal features, e.g., minimum device length and width.

So, in this example, a bit select circuit 106, which may also include tailored FETs, selects a column of cells in the array 102. A word decoder 108 selects a row of cells in the array 102 connected to a word line that is driven by the word line drivers 104. So, in this example, the array 102 is addressed by coincidence of a selected column with a selected row and cells in unselected columns on the selected row are partially or half selected. Sense amplifiers 110 sense data stored in selected cells that are coupled to the sense amplifiers 110 during a read. Data input/output (I/O) drivers 112 receive input data and drive sensed data, e.g., off chip, passed to the I/O drivers 112 from the sense amplifiers 110. Clock logic 114 provides local timing and glue logic 116 provides local control, e.g., read/write select, address gating and buffering, etc. Selected devices in data path circuits, including for example, the bit select circuit 106, word decoder 108 and sense amplifiers 110 may be tailored devices, accompanied in part or in whole by the same increased supply voltage. Otherwise, typically, the remaining circuits, including the I/O drivers 112, clocks 114 and glue 116 and especially critical paths in those circuits are all base design devices with no enhancements and powered by the normal, lower supply voltage.

So, primarily, non-array circuits 112, 114, 116 (and critical paths in those circuits) are supplied by $V_{dd}$, which is typical or a base or baseline supply for the particular technology, e.g., 1.0V. The array 102 and data path circuits 104, 106, 108, 110 or portions thereof (i.e., in non-critical paths), are powered by $V_{dd+}$, e.g., 1.1-1.4V, for improved performance as well as improved immunity to half select upsets. Preferably, $V_{dd+}$ is at least as much above $V_{dd}$ as the difference between the base device threshold and the high threshold, i.e., $V_{dd+}-V_{dd} > |V_{T+}-V_T|$. Thus, increasing the supply compensates for tailored cell NFET threshold, $V_{T+}$, mitigating any performance loss that might have otherwise occurred.

Figure 2:
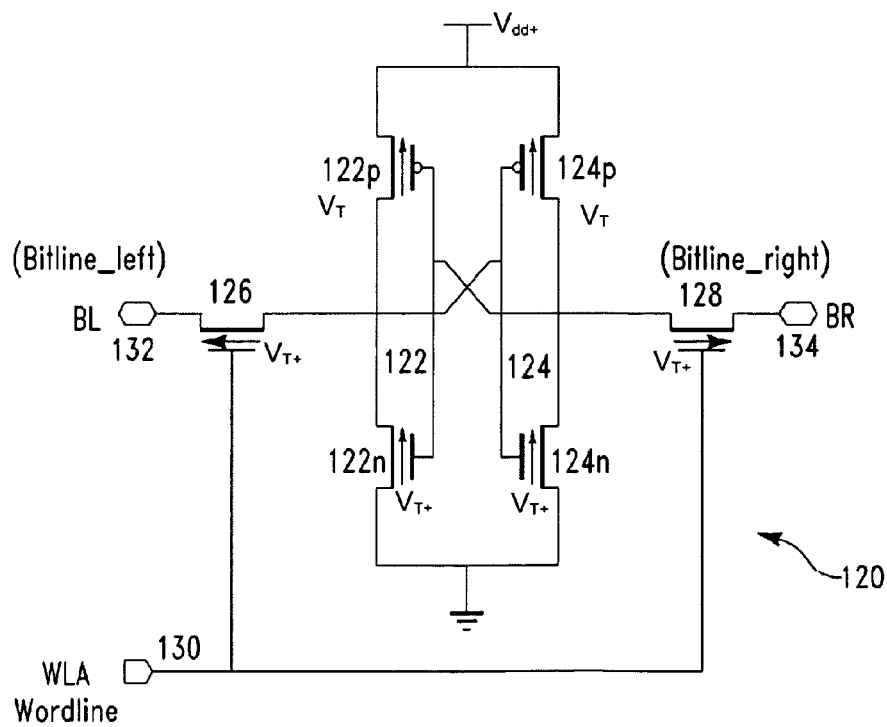
FIG. 2 shows an example of a preferred six transistor (6T) storage cell or latch from an array of such latches or cells.

FIG. 2 shows an example of a preferred six transistor (6T) storage cell 120 or latch from an array 102 of such latches or cells 120. Data is stored in the cell 120 in a pair of cross coupled inverters 122, 124 accessed through a pair of pass gate FETs 126, 128. The gates of pass gate FETs 126, 128 are connected to a word line 130 that selectively couples the cell contents to a pair of complementary bit lines (Bitline_left (BL) and Bitline_right (BR)) 132, 134. Each word line (e.g., WLA) 130 is connected to pass gates 126, 128 in a row of cells 120 and each pair of complementary bit lines 132, 134 is connected to a column of cells 120 in the array 102. Cell selection is by coincidence of a selected word line 130 with a selected bit line pair 132, 134. The cross coupled inverters 122, 124 are connected between an increased voltage supply line 136 and supply return or array ground 138. Preferably in this example, the NFETs 122N, 124N, 126, 128 in the cell 120 are tailored NFETs with a threshold that is higher than the typical baseline NFET in support circuits, e.g., 112, 114, 116. Additionally, word line drivers 104 include tailored FETs (preferably PFETs) driving the word lines 130. Optionally, data path circuits, e.g., 106, 108, 110 may also include selected tailored FETs. For an example of using low leakage devices, e.g., tailored FETs, in logic similar to the word line drivers 104 or data path circuits 106, 108, 110; see, U.S. patent application Ser. No. 10/644,211, entitled "Method Of Reducing Leakage Current In Sub One Volt SOI Circuits" to Richard B. Brown et al., filed Aug. 22, 2003, now issued as U.S. Pat. No. 6, 952,113 B2, assigned to the assignee of the present invention and incorporated herein by reference.

Figure 3A:
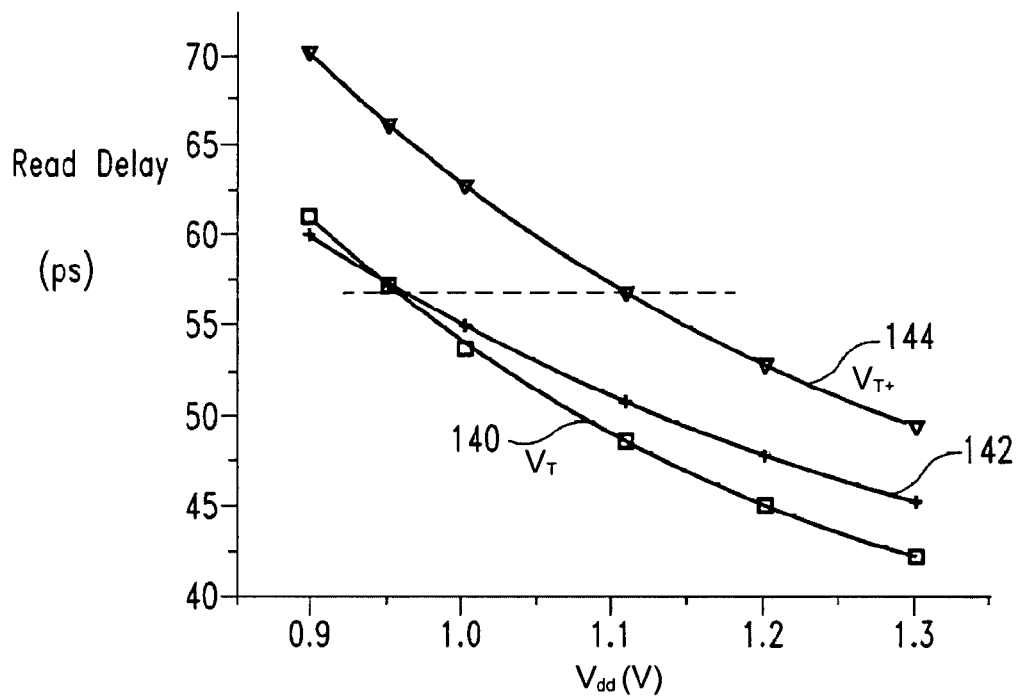
FIGS. 3A-B show comparisons of the effects of tailoring cell devices on read performance and on cell stability.
Figure 3B:
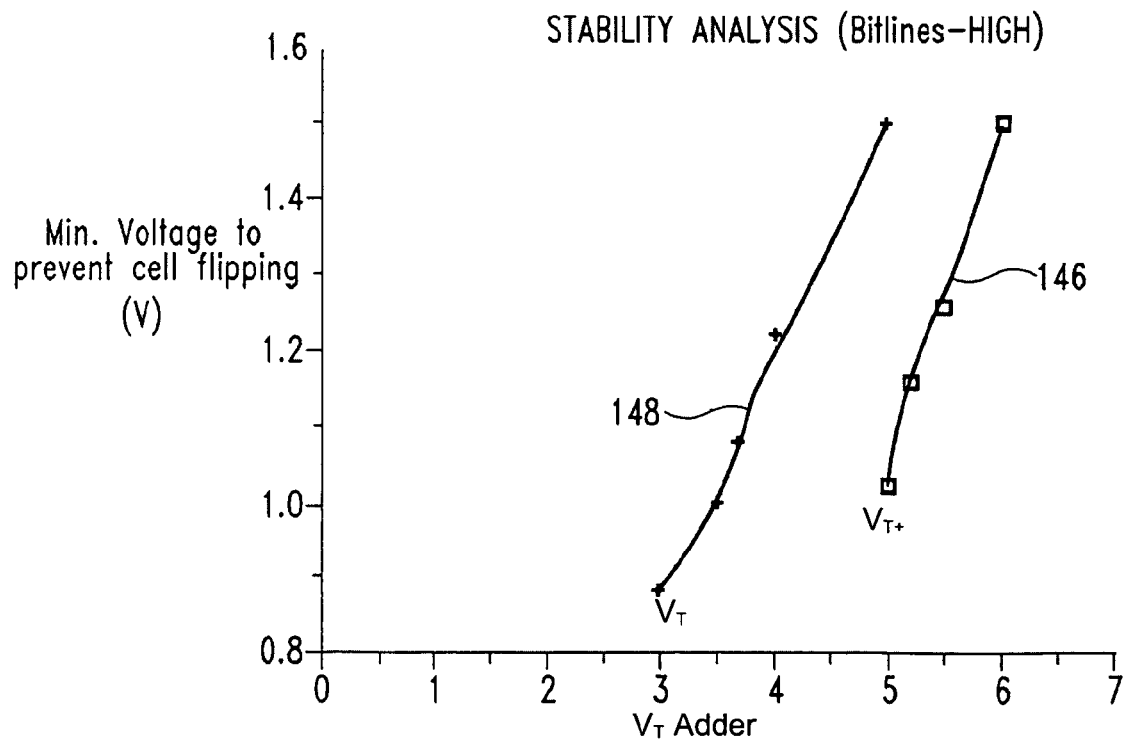

FIGS. 3A-B show comparisons of the effects of tailoring cell devices on read performance and on cell stability. Curve 140 shows the response of cells with channels of selected devices (e.g., NFETs 122N, 124N, 126, 128) implanted with an additional device tailoring implant (which increases VT) to reduce subthreshold leakage over standard VT cells. Curve 142 shows the response of the same cells with modified gate dielectric (e.g., thickened or a high k dielectric used) to reduce gate leakages including gate to channel, gate to source or drain and gate induced drain leakage (GIDL). See, e.g., U.S. application Ser. No. 10/307,168, entitled "Reduced Integrated Circuit Chip Leakage and Method of Reducing Chip Leakage" to Chuang et al., filed Nov. 29, 2002 and published Jun. 3,2004 as US 2004/0105300 A1, now issued as U.S. Pat. No. 6,798,682 B2, assigned to the assignee of the present invention and incorporated herein by reference. So, while either gate leakage 140 or subthreshold leakage 142 is reduced, some leakage of the other type (subthreshold 142 or gate 140) still occurs and is exacerbated by increasing cell supply voltage to offset any increase in array access time (Read Delay in picoseconds (ps)), i.e., either performance degrades because increased device VT (e.g., by 100millivolts (100mV)) reduces device drive or, leakage continues or increases as Vdd is increased, e.g., from 1.0V to 1.1-1.4V. By contrast, both gate leakage and subthreshold leakage are reduced in a preferred embodiment cell 120 as shown by the curve 144. While the threshold increase is slightly more, e.g., 100-200mV over the baseline threshold, the leakage sensitivity to supply voltage is dramatically improved and performance can more than be recovered by raising supply voltage without re-increasing leakage current. So curve 144, essentially, is a common curve showing the response of the same cells with both the additional device tailoring implant and modified gate dielectric; and overlaying the response of the same cells with NFETs having both the additional device tailoring implant and modified gate dielectric curve and PFETs having modified gate dielectric. Furthermore, the beta ratio (ratio of on resistance) between the cell pass gates and connected cross coupled NFETs is maintained, even at Vdd+ for improve cell stability, e.g., reduced sensitivity to upsets in half selected cells. So, as can be seen from the Stability Analysis graph of FIG. 3B, with Bitlines held high preferred cell stability 146 (i.e., minimum voltage to prevent cell flipping) is increased (i.e. a $V_T$ adder(G)) considerably over the same cells with either the additional device tailoring implant or modified gate dielectric 148.

As noted hereinabove, selected circuit devices are tailored to minimize leakage. For example, channels are implanted on selected devices and gate oxide selectively thickened above a stated design gate oxide thickness, e.g., e.g., 15-30% above design. Similarly, although the preferred embodiments are described herein for simplicity of description with reference to thicker gate oxides and doped channels, any other method of selectively increasing threshold voltage to reducing subthreshold leakage has application as well, such as by using a high k dielectric. Accordingly, reference to a tailored device includes such other methods and approaches to increasing device thresholds for reduced leakage. Examples of suitable high k gate dielectrics include $Al_2O_3$, $ZrO_2$, $HfO_2$, $InO_2$, $LaO_2$ and $TaO_2$. These high k metal oxide dielectrics are provided for example only. Further, it is understood that although described for tailored NFETs in a PD SOI CMOS SRAM, this is for example only and not intended as a limitation. The present invention has much wider application to almost any device type in any type of circuit in any multiple threshold technology including for example silicon based device structures—bulk insulated gate FET, fully depleted SOI, double gate CMOS, strained SiGe.

Advantageously, selectively including tailored devices in storage array 102 cells and in the data path and, increasing supply voltage to the array and selectively in the data path according to a preferred embodiment of the present invention, both reduces cell leakage and improves cell stability to recover any performance that might have otherwise been lost. The present invention reduces leakage in SOI arrays, for dramatically reduced standby-leakage power while simultaneously minimizing impact on array access, especially arrays in PD SOI integrated circuits.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. An integrated circuit (IC) chip, wherein said IC is a CMOS IC array, said IC comprising:
   a base voltage source connected to a base supply line and supplying a base voltage;
   a plurality of logic paths, ones of said plurality of logic paths being identified as critical paths, field effect transistors (FETs) in said critical paths having a stated base design characteristic, circuits in said critical paths being connected to said base supply line;

an increased voltage source connected to an increased supply line and supplying an increased voltage, said increased voltage being above said base voltage;

ones of said plurality of logic paths not being identified as one of said critical paths, circuits in said ones having tailored said FETs and connected to said increased supply line, said tailored FETs exhibiting less leakage at said base voltage than FETs having said stated base design characteristic, wherein said stated base characteristic is a base threshold voltage ($V_T$) and said tailored FETs have an increased threshold voltage ($V_{T+}$) that is greater than said base $V_T$ and, said increased voltage ($V_{dd+}$) exceeds said base voltage ($V_{dd}$) at least by the difference between the base $V_T$ and said increased $V_{T+}$, i.e., $V_{dd+} - V_{dd} > |V_{T+} - V_T|$, and wherein said tailored FETs exhibit less leakage at said increased voltage than FETs having said stated base design characteristic at said base voltage; and an array of storage cells and support circuits for said array, said storage cells and support circuits including tailored FETs and connected to said increased supply line, wherein said array is a static random access memory (SRAM) array, said support circuits comprising:
a word line decoder selecting a row of cells in said array,
a plurality of word line drivers, each driving a selected said row,
a bit decoder selecting a column of said cells in said array,
at least one sense amplifier sensing data stored in a selected one of said cells,
at least one input/output (I/O) driver, each said I/O driver passing written data to a selected said column and redriving sensed said data,
local clock logic providing local timing for each cell access, and
glue logic for controlling accesses to said SRAM.

2. An IC chip as in claim 1, wherein said stated base characteristic further is a stated design gate dielectric thickness and said tailored FETs have a thicker gate oxide than said stated design gate dielectric thickness.

3. An IC chip as in claim 1, wherein said stated base characteristic further is a channel dopant characteristic and said tailored FETs have a subthreshold leakage reduction channel implant.

4. An IC chip as in claim 1, wherein said stated base characteristic further is gate oxide and said tailored FETs have a high k gate dielectric material.

5. An IC chip as in claim 1, wherein said stated base characteristic further is a stated design gate dielectric thickness and a channel dopant characteristic and said tailored FETs have a subthreshold leakage reduction channel implant and a thicker gate oxide than a stated design gate oxide thickness.

6. A CMOS IC as in claim 1, wherein said storage cells are, each of said SRAM cells, each comprising:
a pair of cross-coupled inverters, each of said cross coupled inverters comprising:
a first tailored NFET, connected drain to source between a storage node and a return voltage, and
a PFET connected drain to source between said storage node and $V_{dd+}$, said storage node of the other of said pair of cross-coupled inverters connected to a control terminal of both said first tailored NFET and said PFET; and
a pair of tailored NFET pass gates, each connected between one said storage node and one of a pair of complementary bit lines.

7. A CMOS IC as in claim 6, wherein said word line driver is connected to $V_{dd+}$ and to a word line connected to a control terminal in both of said pair of tailored NFET pass gates, said word line driver selectively driving said word line substantially to $V_{dd+}$.

8. A CMOS IC as in claim 7, wherein said IC is on a partially depleted (PD) silicon on insulator (SOI) chip.

* * * * *